United States Patent [19]

Takahashi et al.

[11] Patent Number: 5,384,638
[45] Date of Patent: Jan. 24, 1995

[54] SAMPLING-TYPE OPTICAL VOLTAGE DETECTOR UTILIZING MOVEMENT OF INTERFERENCE FRINGE

[75] Inventors: Hironori Takahashi; Tsuneyuki Urakami; Shinichiro Aoshima, all of Shizuoka, Japan

[73] Assignee: Hamamatsu Photonics K.K., Shizuoka, Japan

[21] Appl. No.: 858,279

[22] Filed: Mar. 26, 1992

[30] Foreign Application Priority Data

Mar. 26, 1991 [JP] Japan ................... 3-086244

[51] Int. Cl.⁶ .......................................... G01B 9/02
[52] U.S. Cl. ............................ 356/351; 356/345
[58] Field of Search .................. 356/351, 353, 345

[56] References Cited

U.S. PATENT DOCUMENTS

| | | | |
|---|---|---|---|
| 3,700,334 | 10/1972 | Low et al. ................... | 356/351 |
| 4,446,425 | 5/1984 | Valdmanis et al. | |
| 4,618,819 | 10/1986 | Mourou et al. | |
| 4,864,220 | 9/1989 | Aoshima et al. ............. | 356/345 |
| 5,029,273 | 7/1991 | Jaeger ......................... | 356/365 |

FOREIGN PATENT DOCUMENTS

| | | |
|---|---|---|
| 0229427 | 1/1989 | European Pat. Off. . |
| 2212265 | 7/1989 | United Kingdom . |

OTHER PUBLICATIONS

"Subpicosecond Electrooptic Sampling: Principles and Applications", Janis A. Valdmanis, et al., IEEE Journal of Quantum Electronics, vol. QE-22, No. 1, Jan. 1986, pp. 69-78.

"High Precision Retardation Measurement Using Phase Detection of Young's Fringes", Suezou Nakadate, Applied Optics, vol. 29, No. 2, Jan. 10, 1990, pp. 242-246.

"Advances in Streak Camera Instrumentation for the Study of Biological and Physical Processes", Yutaka Tsuchiya, IEEE Journal of Quantum Electronics, vol. QE-20, No. 12, Dec. 1984, pp. 1516-1528

"Ultrafast Optical Waveform Characterization", Yutaka Tsuchiya, et al., SPIE vol. 1032, High Speed Photography and Photonics, 1988, pp. 459-467.

"Polarization Interferometer for Measuring Induced Anisotropy", V. A. Zamkov and V. A. Radkevich (pp. 811-816) pp. 437-439.

"Interferometer performing the product of three quantities, Measurement of photorefraction and photogyration in LiIO₃ and Ba₂NaNb₅O₁₅ single crystals", I. A. Rokos, et al., Opt. Spectrosc. (USSR) 64(3), Mar. 1988, pp. 395-397.

"Fringe Scanning Scatter Plate Interferometer Using a Polarized Light", Junejei Huang, et al., Optics Communications, vol. 68, No. 4, Oct. 15, 1988, pp. 235-238.

"Ring polarization interferometer, Measurement of the flow rates of transparent media", I. A. Rokos et al., Opt. Spectrosc. (USSR) 53(2), Aug. 1982, pp. 186-190.

"Analysis of the interference of polarized rays by the method of the Poincare sphere", L. A. Rokosova, et al., Opt. Spectrosc. (USSR) 54(5) May 1983, pp. 496-500.

"Mise en Oeuvre et Optimisaton d'un Modulateur de Retard Optique", M. Allain, et al., Optics Communications, vol. 11, No. 2, Jun. 1974, pp. 196-200.

"Probleme d'Asservissement Pose en Interferometrie a Modulation de Phase par l'Instabilite du Modulateur", Michel Allain, et al., Optics Communications, vol. 39, No. 3, Oct. 1, 1981, pp. 113-117.

"Subpicosecond Electrooptic Sampling: Principles and Applications," J. Valdmanis et al., IEEE Journal of Quantum Electronics, vol. QE-22, No. 1, pp. 69-78, Jan. 1986.

European Search Report dated Oct. 7, 1992.

*Primary Examiner*—Samuel A. Turner
*Assistant Examiner*—Robert Kim
*Attorney, Agent, or Firm*—Finnegan, Henderson Farabow, Garrett & Dunner

[57] ABSTRACT

Polarized light pulses are applied to an optical modulator including an electrooptic crystal. A polarization state of the applied light is changed in accordance with a voltage of an electrical signal applied to the optical modulator. A polarization interferometer receives the light output from the optical modulator, and generates an interference fringe on the input surface of a photodetector such as a one-dimensional CCD. A processing device calculates a pitch and a movement distance of the interference fringe, based on an output signal of the photodetector, to determine the voltage. A waveform of the electrical signal is determined by sampling the electrical signal with multiple light pulses, while varying a phase relationship between the electrical signal and the light pulses.

15 Claims, 7 Drawing Sheets

SAMPLING-TYPE OPTICAL VOLTAGE DETECTOR UTILIZING MOVEMENT OF INTERFERENCE FRINGE

BACKGROUND OF THE INVENTION

The present invention relates to a high-speed voltage detector utilizing an electrooptic crystal.

FIG. 9 shows a conventional example of a high-speed voltage detector 1 called an E-O sampling apparatus. The high-speed voltage detector 1 includes a short-pulsed light source 2, a high-speed optical device 3 such as a high-speed photodetector, a light intensity modulator 4 including a polarizer 4A, optical modulator 4B and analyzer 4C, an optical delay device 5 and a photodetector 6. Short pulse light emitted from the short-pulsed light source 2 is split into two beams by a beam splitter 7. One beam is applied to high-speed optical device 3, whose output is provided to optical modulator 4B as an electrical signal to be measured. The other beam from beam splitter 7 is applied to the optical delay device 5 via a mirror 8A. Output light, which has been delayed by a predetermined time, is applied, via a mirror 8B, to light intensity modulator 4, where it is subjected to intensity modulation in accordance with the electrical signal (i.e., voltage) being applied to the optical modulator 4B and is passed through analyzer 4C to reach the photodetector 6.

As shown in FIG. 10, the voltage V being applied to optical modulator 4B and the intensity I of the light applied to the photodetector 6 via the analyzer 4C has a relationship as represented by following equation (1):

$$I = I^0 \sin^2\{(\pi/2)(V/V\pi)\} \ldots \quad (1)$$

where $V\pi$ is a half-wave voltage of the optical modulator 4B. Accordingly, photodetector 6 detects the light whose intensity has been modulated by the electrical signal to be measured according to equation (1).

An output signal of the photodetector 6 is amplified by an amplifier 9, and then provided to an X/Y recorder 10. The X/Y recorder 10 reproduces the whole waveform of the electrical signal under measurement using a delay time signal X from optical delay device 5 and a signal Y from the photodetector 6 while the delay time is continuously varied to change the sampling point. The principle of this measurement is described below in detail.

It is assumed that a waveform of the electrical signal to be measured and the input short pulse light to the optical modulator 4B has a relationship as shown in FIG. 11. At delay time Ta (caused by the optical delay device 5 and measured from the reference time point), point A of the electrical signal is measured. Since the voltage is zero at delay time Ta, no change occurs in the output signal of the photodetector 6.

At delay time Tb, point B is measured to generate an output that depends on a voltage Vb. Similarly, at delay time Tc, a voltage Vc at point C is measured. In this manner, the whole waveform of the electrical signal is measured.

The optical delay device 5 can operate slowly and, as a benefit of the sampling-type measurement, it suffices that the photodetector 6 just follow the variation of the delay time. Therefore, the photodetector 6 can also have a slow response speed.

Since the optical modulator 4B operates very fast, the response speed of the voltage detector 1 is determined by a width of the pulse light emitted from the short-pulsed light source 2.

However, as shown in FIG. 10, in the high-speed voltage detector 1, the voltage V applied to the optical modulator 4B and the intensity I of the output light from the analyzer 4C do not have a linear relationship. Therefore, in order to determine the voltage V from the light intensity I, a conversion reverse to the FIG. 10 characteristic needs to be performed. In doing so, however, in the range of small voltages V where the intensity I varies very little with respect to a variation of the voltage V, precise measurements can hardly be performed.

In order to solve this problem, usually a quarter-wave plate is disposed between the polarizer 4A and the analyzer 4C to provide an optical bias so as to establish an operating point at $V = V\pi/2$, and measurements are performed while applying a small modulation voltage v ($<<V\pi/2$) in the vicinity of the operating point. Since, in this case, an approximately linear relationship holds between the modulation voltage v and the modulated output light intensity I, a conversion reverse to the FIG. 10 characteristic is not required. However, this measurement method still has a problem that it only enables a measurement of a small voltage v ($<<V\pi/2$). That is, this type of voltage detector cannot be applied to measurement of such a large voltage V as is about the same as or larger than the half-wave voltage $V\pi$.

Further, in the high-speed voltage detector 1, when the voltage V is gradually increased to reach $V\pi$, the output light intensity I starts to decrease as understood from FIG. 10, which also prevents correct measurements.

SUMMARY OF THE INVENTION

The present invention has been made in view of the above problems of the prior art, and has an object of providing a high-speed voltage detector that can readily measure not only a small voltage but a large voltage without performing an additional operation such as a conversion reverse to an input voltage-output light intensity characteristic.

According to an aspect of the present invention, a voltage detector comprises means for emitting a plurality of polarized light pulses; modulating means, responsive to a first signal, for changing a polarization state of the polarized light pulse in accordance with a voltage value of the first signal; means for setting a respective phase relationship between each of the plurality of polarized light pulses and the first signal, and for generating a second signal to indicate the phase relationship; means, coupled to the modulating means, for generating an interference fringe; and means, responsive to the second signal, for determining a waveform of the first signal by detecting respective displacements of the interference fringe corresponding to each one of the plurality of light pulses.

According to another aspect of the present invention, a system, adapted for receiving a first signal, comprises first means for generating a second signal of polarized light; second means, responsive to an amplitude of the first signal, for changing a polarization state of the second signal to generate a third signal of polarized light; third means, responsive to the third signal, for generating an interference pattern; fourth means for detecting a displacement of the interference pattern from a nominal position; and fifth means for activating the fourth means a plurality of times, each time corresponding to a respective phase of the first signal.

According to another aspect of the present invention, a method of determining a waveform of a first signal comprises the steps of generating a second signal of polarized light; changing, responsive to an amplitude of the first signal, a polarization state of the second signal to generate a third signal of polarized light; generating, responsive to the third signal, an interference pattern; detecting a displacement of the interference pattern from a nominal position; and activating the detecting step a plurality of times, each time corresponding to a respective phase of the first signal. In the preferred embodiments of the present invention an interference fringe is generated in accordance with the polarization state of light incident upon a polarization interferometer, and the interference fringe moves in proportion to the value of the voltage signal. Since the voltage variation and the movement distance of the interference fringe have a linear relationship, it is not necessary to perform a conversion reverse to the input voltage-output light intensity characteristic of the conventional high-speed voltage detector of FIG. 9. This greatly facilitates the voltage detection. Further, the good linearity provides highly precise measurements. In addition, the measurement can be performed irrespective of a value of a half-wave voltage of the modulating means.

DESCRIPTION OF THE PREFERRED EMBODIMENTS

Embodiments of the present invention are described hereinafter with reference to the accompanying drawings. The applicants of the present invention are also the applicants of application of Hironori Takahashi, Tsuneyuki Urakami and Shinichiro Aoshima for OPTICAL VOLTAGE DETECTOR UTILIZING MOVEMENT OF INTERFERENCE FRINGE, filed Mar. 25, 1992, the contents of which are herein incorporated by reference.

Figure 1:
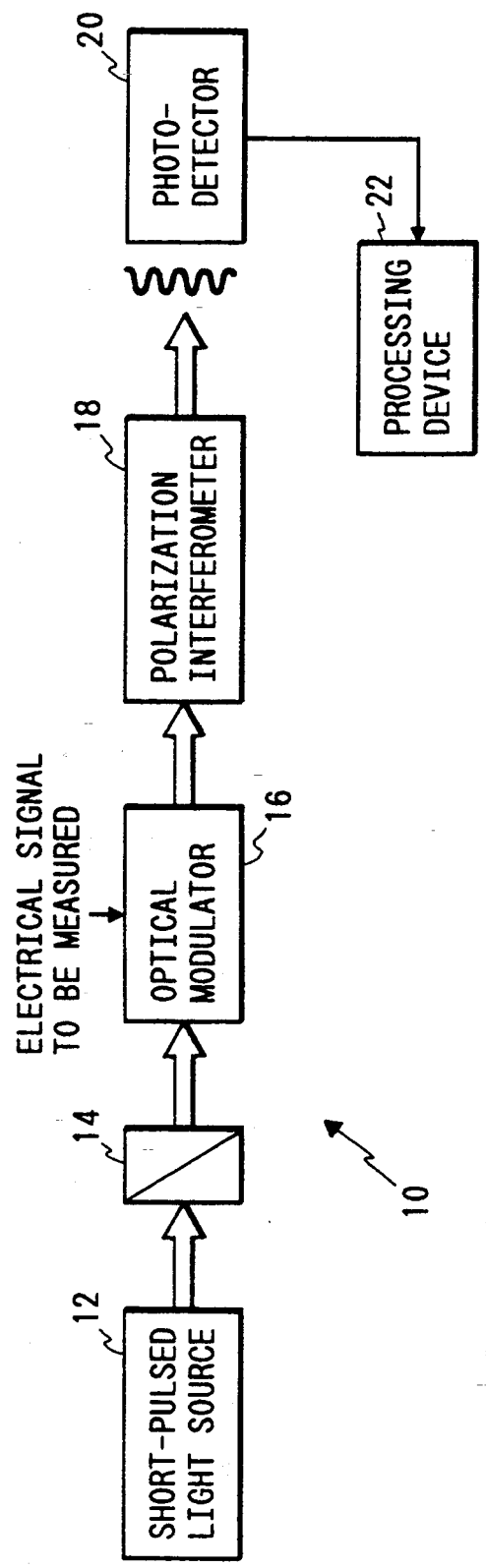
FIG. 1 is a block diagram showing a high-speed voltage detector according to a first embodiment of the present invention.

FIG. 1 shows a high-speed voltage detector 10 according to a first preferred embodiment of the present invention. The voltage detector 10 includes a short-pulsed light source 12, a polarizer 14, an optical modulator 16 having an electrooptic crystal to which an electrical signal to be measured is applied, a polarization interferometer 18, a photodetector 20 for detecting output light from the polarization interferometer 18, and a processing device 22 for processing an output signal of photodetector 20. These components are arranged in the above order, from short-pulsed light source 12 to processing device 22. A voltage of the electrical signal is detected while being sampled based on a movement distance of an interference fringe formed on the input surface of photodetector 20. The interference fringe moves in accordance with the electrical signal applied to optical modulator 16. The polarizer 14 can be omitted if the pulsed light source 12 emits polarized pulse light.

Figure 2:
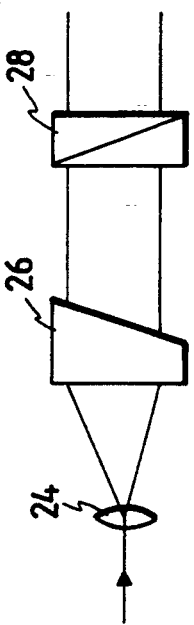
FIG. 2 is a diagram of a polarization interferometer employed in the first embodiment.

FIG. 2 shows the polarization interferometer 18, including an objective lens 24, birefringent crystal 26 and analyzer 28, arranged in this order. The analyzer 28 is disposed so that its polarizing direction forms an angle of 45° with the optical axis of birefringent crystal 26.

The photodetector 20 includes a one-dimensional CCD. The processing device 22 determines the voltage V based on equation (2) (described below) using intervals A and a movement distance X of peaks of the interference fringe that are obtained from an output signal of photodetector 20.

The operation of the high-speed voltage detector 10 is described below.

Upon entrance into polarization interferometer 18, polarized light is expanded by objective lens 24, and then applied to birefringent crystal 26. In birefringent crystal 26, the applied light beam is split into two beams that have different polarization states in a direction determined by the optical axis of birefringent crystal 26 and in a direction perpendicular thereto, and that travel along different paths. As a result, the two beams having an optical path difference are output from polarization interferometer 18. Since, as described above, analyzer 28 is arranged with its polarizing direction at an angle of 45° with the optical axis of birefringent crystal 26, the two beams output from birefringent crystal 26 and having orthogonal polarization states interfere each other after passing through analyzer 28, and a resulting interference fringe is formed on the input surface of photodetector 20.

The optical modulator 16 changes the polarization state of the light in accordance with the voltage being applied thereto, and provides the resulting light to polarization interferometer 18. Therefore, the interference fringe, formed on the input surface of photodetector 20 by polarization interferometer 18, moves in proportion to the polarization state variation caused by optical modulator 16, i.e., in proportion to the input voltage variation.

A movement distance X of the interference fringe is given by:

$$X = (A/2)(V/V\pi) \ldots \quad (2)$$

where A represents an interval, or pitch, between adjacent peaks of the interference fringe, V the voltage being applied to optical modulator 16, and $V\pi$ the half-wave voltage.

Figure 3:
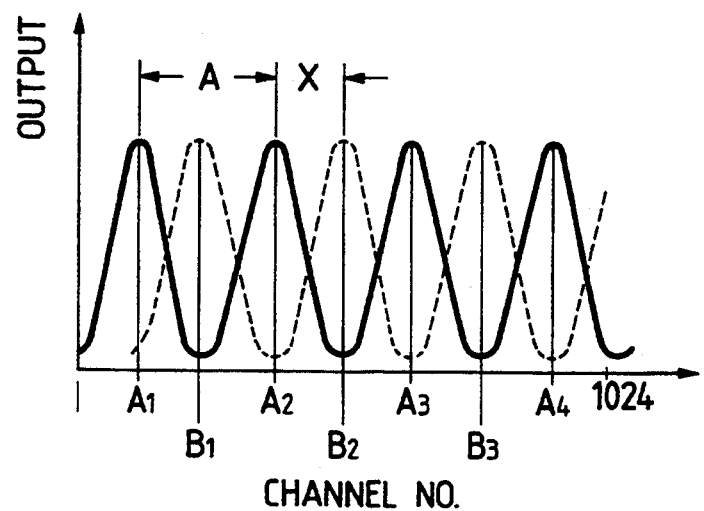
FIG. 3 is a diagram of waveforms of output signals of a photodetector employed in the first embodiment.

FIG. 3 shows an example of output signals of photodetector 20 that is a one-dimensional charge coupled device (CCD) having 1,024 channels. The solid line of FIG. 3 represents an output signal caused by an interference fringe that is obtained when no voltage is applied to optical modulator 16. In other words, the solid line represents a nominal position of the interference fringe. The processing device 22 first determines channels A1–A4 of four peaks of the solid line waveform, and then determines an interval A between these channels A1–A4.

When a voltage is applied to optical modulator 16, channels B1–B4 of four peaks of an output signal (dashed line of FIG. 3) of photodetector 20 caused by an interference fringe are determined. A movement distance X of the interference fringe is determined by comparing spatial positions corresponding to channels B1–B4 with spatial positions corresponding to channels A1–A4 already obtained. In other words, a displacement from the nominal position is determined. The voltage V is calculated using equation (2) described above using the movement distance X thus determined.

The movement speed of the interference fringe caused by a variation of the voltage being applied to optical modulator 16 is determined by characteristics of optical modulator 16, and is therefore very fast. However, since the voltage is sampled by means of short pulse light emitted from light source 12, a fast-varying voltage can be measured even in the case where the response speed of photodetector 20 is slow.

In the above embodiment, the movement distance X of the interference fringe can be measured more precisely if the output signal of photodetector 20 is Fourier-converted and a phase of the Fourier-conversion signal is detected. This improvement in measurement precision, compared with the case of determining the voltage based on only the peaks of a signal representing the interference fringe, originates from the fact that the calculation is performed using every point of the signal.

While in the above embodiment the angle formed between the polarizing direction of analyzer 28 and the optical axis of birefringent crystal 26 is 45°, that angle is not limited to such a specific value, but may take any value as long as the two directions are not identical to or perpendicular to each other.

Figure 4:
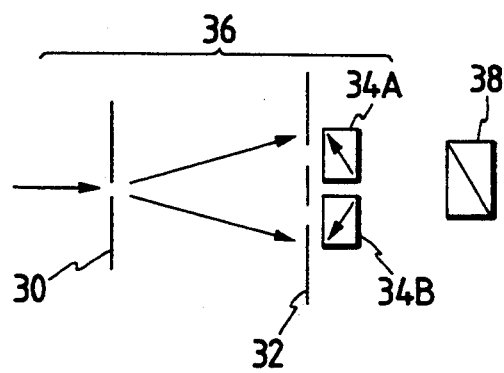
FIG. 4 is a diagram of a polarization interferometer employed in a second embodiment.

While in the first embodiment polarization interferometer 18 includes birefringent crystal 26, the interferometer 18 of the preferred embodiments of the invention is not limited to this type, but may be of other types. FIG. 4 shows an alternative polarization interferometer used in a second embodiment of the present invention. This type of polarization interferometer includes a Young interferometer 36 having a single slit 30 and double slits 32. Double slits 32 extend in parallel with single slit 30. Polarizer elements 34A and 34B are attached to the respective slits of the double slit 32 such that their polarizing directions form angles of +45° and −45° with the longitudinal direction of the single slit 30. An analyzer 38 having a polarizing direction parallel with or perpendicular to that of polarizer 14 is disposed on the output side of Young interferometer 36.

Upon entrance into Young interferometer 36, the output light from the optical modulator 16 is diffracted and spread by the single slit 30, and then reaches the double slits 32. Since the polarizer elements 34A and 34B, provided on the double slits 32, have orthogonal polarizing directions, they produce light beams having orthogonal polarization states. The light beams pass through analyzer 38 and then interfere with each other. As a result, an interference fringe is formed on the input surface of photodetector 20.

Incidentally, an interval A of bands of the interference fringe is given by:

$$A = \lambda L / 2d \ldots \quad (3)$$

where $\lambda$ represents a wavelength of light emitted from the light source 12, L a distance between double slits 32 and the photodetector 20, and $2d$ an interval between the two slits of double slits 32.

When a voltage is applied to the optical modulator 16, a phase difference between the two light beams having orthogonal polarization states is changed. The interference fringe moves in accordance with this variation of the phase difference.

While in the second embodiment shown by FIG. 4 the polarizing directions of the polarizer elements 34A and 34B form angles of +45° and −45° with the longitudinal direction of the single slit 30, those angles are not limited to such specific values, but may be any angle provided that the polarizing directions are not identical to the longitudinal direction of single slit 30. Further, the analyzer 38 may have any polarizing direction as long as it does not coincide with one of the polarizing directions of polarizer elements 34A and 34B.

Figure 5:
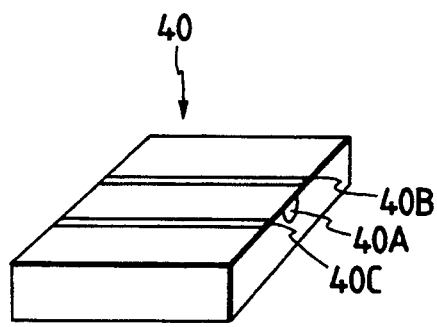
FIG. 5 is a perspective view of a waveguide-type optical modulator employed in a third embodiment.

FIG. 5 shows a third embodiment of the present invention. The third embodiment is intended to provide a small half-wave voltage $V\pi$. In the third embodiment, a waveguide-type optical modulator 40 is used as the optical modulator 16 of FIG. 1. With waveguide-type optical modulator 40, the half-wave voltage $V\pi$ can be made as small as, for instance, 10 V by reducing an interval between electrodes 40B and 40C arranged on both sides of a waveguide 40A to intensify an electric field developing in an electrooptic crystal and by elongating the electrodes 40B and 40C (so as to become longer than the width of the waveguide 40A) to increase the interaction length.

When the half-wave voltage $V\pi$ has a small value, the ratio of the movement distance of the interference fringe to a variation of the voltage applied across the electrodes 40B and 40C becomes large, thereby enabling highly precise measurements.

In the third embodiment, in analyzing the output signal of photodetector 20 (i.e., one-dimensional CCD) in processing device 22, one of its peaks (see FIG. 3) of the output signal caused by the interference fringe may be monitored, and the movement distance of the interference fringe may be determined by examining movement of that particular peak. Where the movement distance is so long that the peak being monitored moves beyond the range of the CCD, processing device 22 then begins to monitor a different peak in the midst of an observation. In this manner, the voltage detector can detect the voltage without any limitation on its upper value (with respect to the half-wave voltage). In other words, although the optical modulator may have a small half-wave voltage of 10 V, a voltage larger than the half-wave voltage 10 V can be detected by the voltage detector 10.

Figure 6:
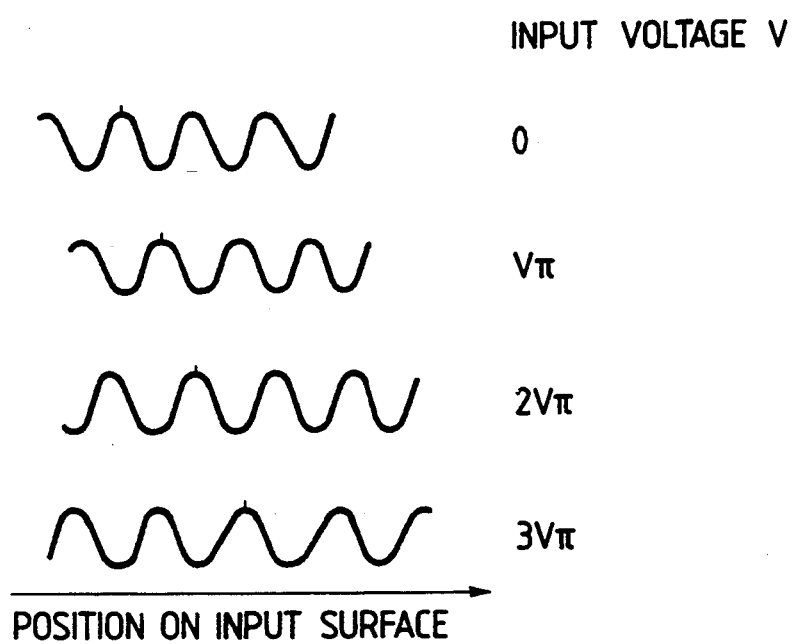
FIG. 6 is a diagram showing waveforms illustrating an operation of the preferred embodiments of the invention.

In other words, as the input voltage to the waveguide-type phase modulator 16 increases, the interference fringe formed on the input surface of the semiconductor position-sensitive detector 20 moves accordingly as shown in FIG. 6. Since there is no upper limit on the input voltage, the movement distance of the interference fringe does not have an upper limit either. The processing device 22 can measure the movement distance of the interference fringe by examining the movement distance of more than one peak.

Figure 7:
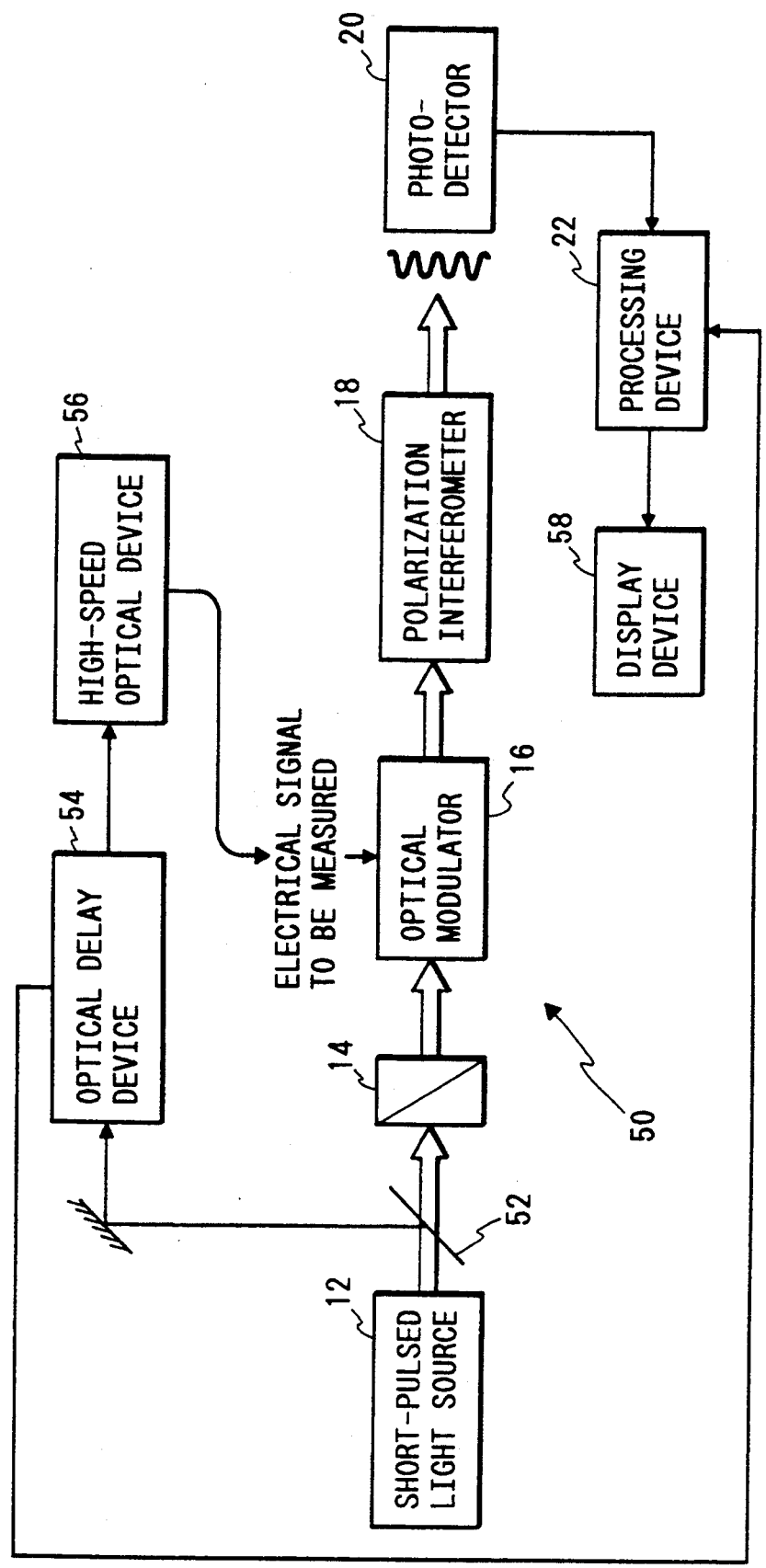
FIG. 7 is a block diagram of a fourth embodiment of the present invention.

FIG. 7 shows a fourth embodiment of the present invention. In the fourth embodiment, polarized light pulses are applied to an optical modulator including an electrooptic crystal. A polarization state of the applied light is changed in accordance with a voltage of an electrical signal applied to the optical modulator. A polarization interferometer receives the light output from the optical modulator, and generates an interference fringe on the input surface of a photodetector such as a one-dimensional CCD. A processing device calculates a pitch and a movement distance of the interference fringe, based on an output signal of the photodetector, to determine the voltage. A waveform of the electrical signal is determined by sampling the electrical signal with multiple light pulses, while varying a phase relationship between the electrical signal and the light pulses.

More specifically, in the fourth embodiment, an output signal of a high-speed optical device 56 is generated when optical device 56 receives a light pulse. The output signal generated by high-speed optical device 56 is measured by a high-speed voltage detector 50. Pulse light emitted from a short-pulsed light source 12 is split into two beams by a half mirror 52. One of the two beams is applied to a polarization interferometer 18 via a polarizer 14 and an optical modulator 16, and a resulting interference fringe is detected by a photodetector 20. An output signal of photodetector 20 is sent to a processing device 22. The other beam is applied to a high-speed optical device 56 via an optical delay device 54. An output signal of high-speed optical device 56 as an electrical signal to be measured is applied to optical modulator 16. The electrical signal is detected based on a movement distance of the interference fringe in a manner similar to that already described in connection with the first embodiment of FIG. 1.

In this embodiment, a signal indicating an optical delay produced by the optical delay device 54 is sent to processing device 22, where it is used as a parameter of the X-axis when a waveform of the electrical signal is determined. In processing device 22, the electrical signal is plotted as a Y-axis parameter. As a result, the waveform of the electrical signal determined in the processing device 22 is displayed on a display device 58.

Optical delay device 54 functions to gradually, or incrementally, change a phase relationship between pulse light applied to optical modulator 16 and the signal generated by high-speed optical device 56.

Figure 8:
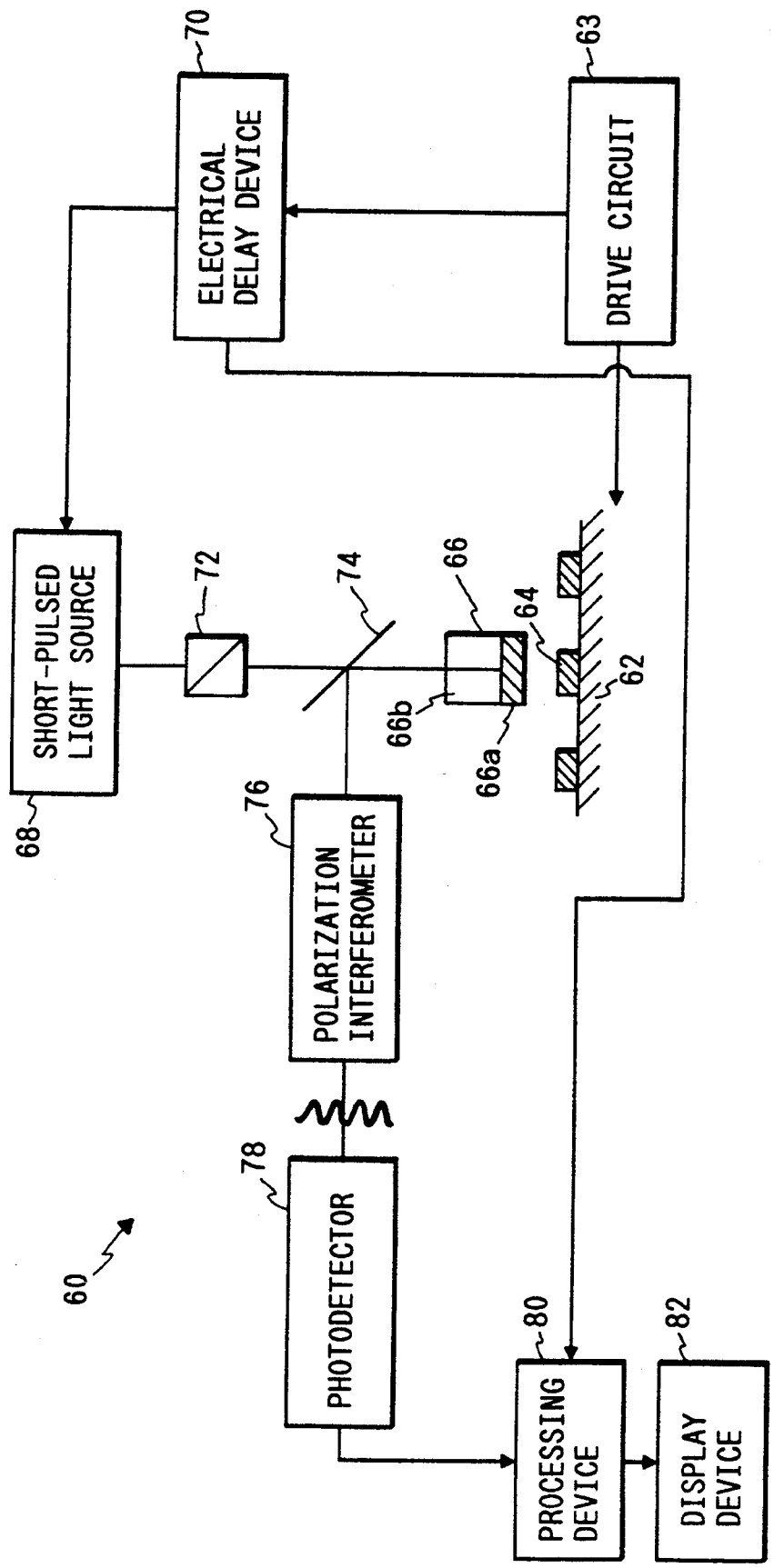
FIG. 8 is a block diagram of a fifth embodiment of the present invention.
Figure 9:
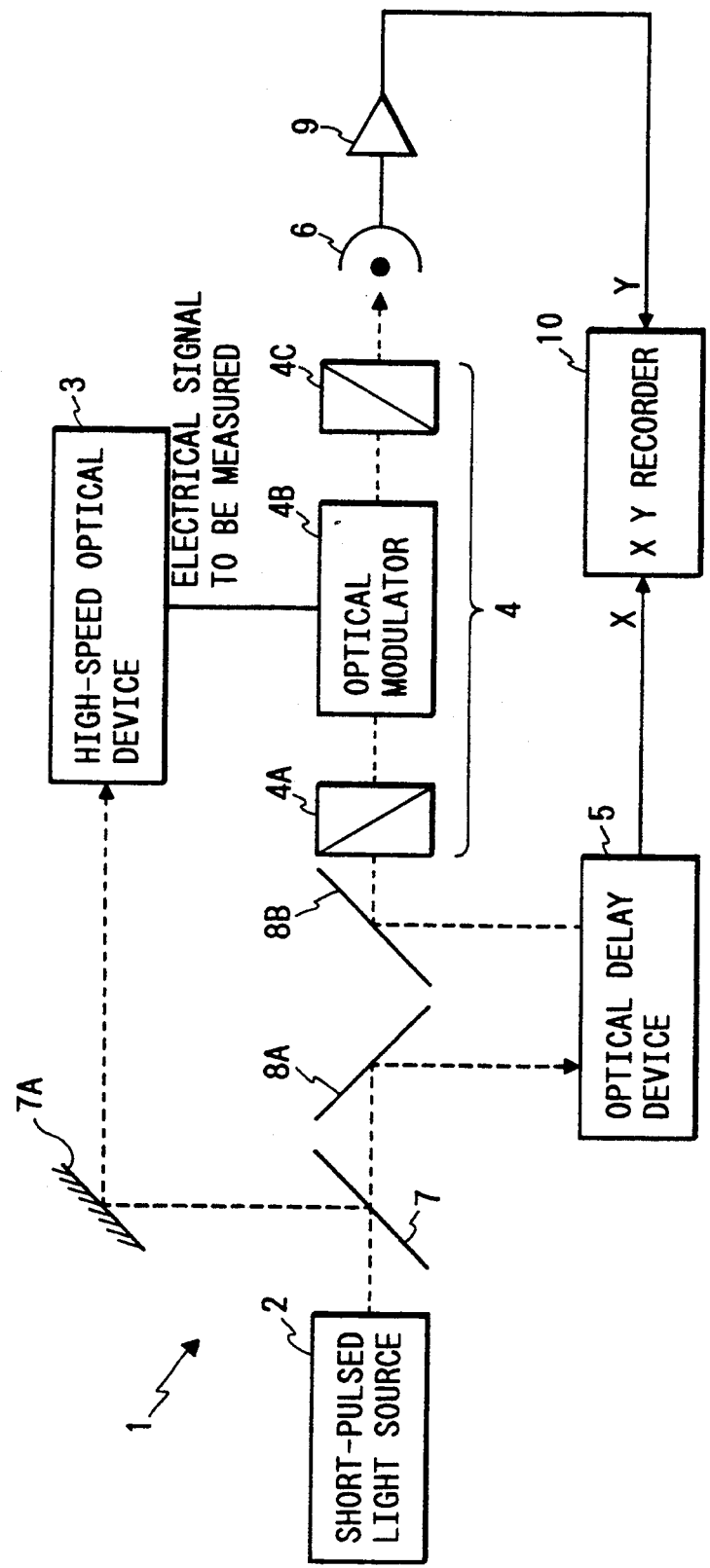
FIG. 9 is a block diagram showing a conventional high-speed voltage detector.
Figure 10:
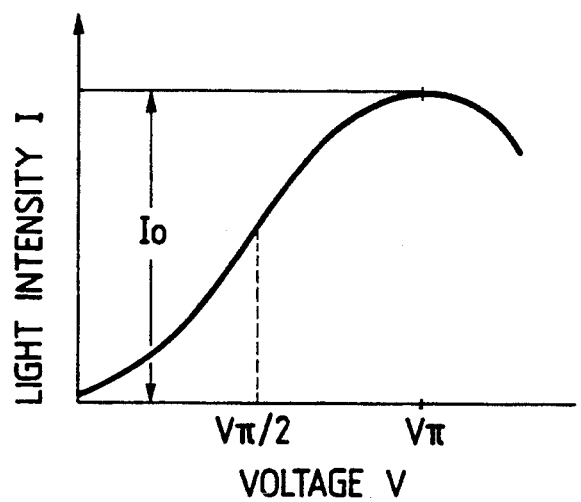
FIG. 10 is a graph showing a relationship between a voltage applied to an optical modulator and intensity of output light from a photodetector, in the high-speed voltage detector of FIG. 9.
Figure 11:
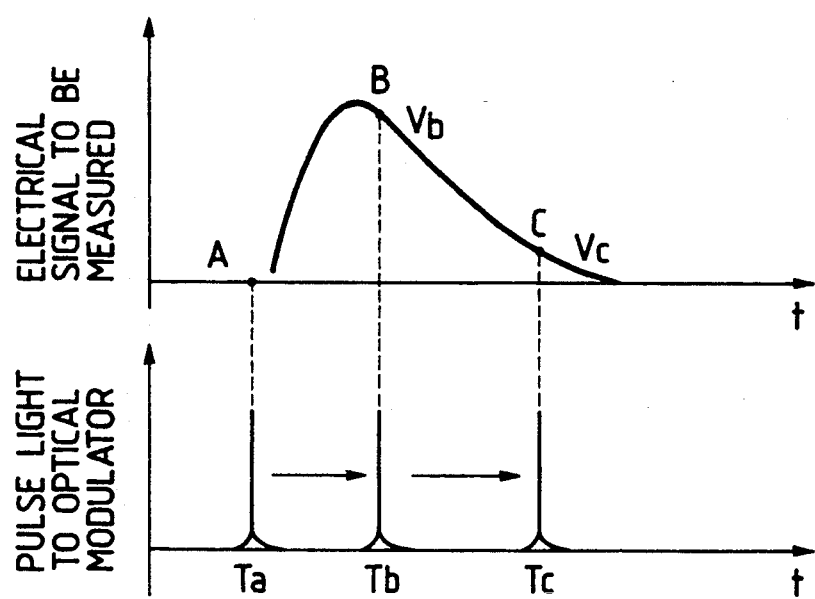
FIG. 11 is a diagram of waveforms to illustrate a relationship between pulse light incident on the optical modulator and an electrical signal to be measured, in the high-speed voltage detector of FIG. 9.

FIG. 8 shows a fifth embodiment of the present invention. An electrical device 62 to be subjected to measurement by a high-speed voltage detector 60 is driven by a drive circuit 63. An electrical signal of an electrode 64 on electrical device 62 is measured using a non-contact-type optical modulator 66 having an electrooptic material 66b and a mirror 66a formed thereon. Since the refractive index of the electrooptic material 66b is changed in accordance with a variation of electric lines of force from the electrode 64, the optical modulator 66 can change the polarization state of light input thereto.

A short-pulsed light source 68, such as a semiconductor laser, emits pulse light while receiving an output signal of the drive circuit 63 via an electrical delay device 70. The pulse light from pulsed light source 68 is applied to the non-contact-type optical modulator 66 via a polarizer 72 and a half mirror 74, reflected by mirror 66a of the optical modulator 66, then reflected by half mirror 74, and finally enters a polarization interferometer 76. A resulting interference fringe is detected by a photodetector 78. An output signal of photodetector 78 is provided to a processing device 80, where a waveform of the electrical signal is determined using a signal indicating the optical delay produced by the optical delay device 70. The waveform thus determined is displayed on a display device 82.

Electrical delay device 70 functions to gradually, or incrementally, change a phase relationship between pulse light applied to optical modulator 66 and the signal applied to electrical device 62 by drive circuit 63. Drive circuit 63 functions to cause short-pulsed light source 68 to generate a pulse.

In the preferred embodiments of the invention, photodetector 20 may be constituted of other types of detector, such as a one-dimensional image sensor or a two-dimensional image sensor (e.g., a CCD camera).

What is claimed is:

1. A voltage detector comprising:
    means for emitting a plurality of polarized light pulses;
    modulating means, responsive to a signal to be measured, for changing a polarization state of the polarized light pulses in accordance with a voltage value of the signal to be measured;
    means for setting a respective phase relationship between each of the plurality of polarized light pulses and the signal to be measured, and for generating a phase signal to indicate the phase relationship;
    means, coupled to the modulating means, for generating an interference fringe;
    means, responsive to the phase signal, for determining a waveform of the signal to be measured by detecting respective displacements of the interference fringe corresponding to each one of the plurality of light pulses; and
    means for calculating the voltage value of the signal to be measured from the waveform of the signal to be measured.

2. The voltage detector of claim 1, wherein the determining means includes means for detecting a pitch of the interference fringe.

3. The voltage detector of claim 1, wherein the determining means includes means for detecting a displacement of multiple peaks of the interference fringe.

4. The voltage detector of claim 1, wherein the interference fringe generating means includes
    a birefringent crystal adapted to receive the signal to be measured; and
    an analyzer opposed to the birefringent crystal.

5. The voltage detector of claim 1, wherein the interference fringe generating means includes
    a first member defining a single slit;
    a second member defining two slits parallel to the single slit;
    two polarizer elements opposed to the two slits of the second member and having orthogonal polarizing directions; and
    an analyzer opposed to the two polarizer elements.

6. The voltage detector of claim 5, wherein the analyzer has a polarizing direction at angles of $+45°$ and $-45°$ to polarizing directions of the two polarizer elements.

7. The voltage detector of claim 1, wherein the determining means includes a one-dimensional CCD.

8. The voltage detector of claim 1, wherein the modulating means includes an electrooptical modulator.

9. The voltage detector of claim 8, wherein the electrooptical modulator is of a waveguide type.

10. The voltage detector of claim 1, wherein the emitting means includes a pulsed light source; and
a polarizer coupled to the pulsed light source.

11. A system, adapted for receiving a signal to be measured, comprising:
first means for generating an input light of polarized light;
second means, responsive to an amplitude of the signal to be measured, for changing a polarization state of the input light to generate an output light of polarized light;
third means, responsive to the output light, for generating an interference pattern;
fourth means for detecting a displacement of the interference pattern from a nominal position;
fifth means for activating the fourth means a plurality of times, each time corresponding to a respective phase of the signal to be measured; and
sixth means for calculating the amplitude of the signal to be measured from the displacement of the interference pattern.

12. The system of claim 11, wherein the third means includes
means for generating an interference pattern having a plurality of peaks, and wherein the fourth means includes
means for detecting a displacement of the interference pattern by monitoring respective movements of the plurality of peaks.

13. The system of claim 11, wherein the fourth means includes
a charge coupled device, responsive to the interference pattern, including means for generating an output signal; and
a processor responsive to the output signal.

14. The system of claim 11, wherein the fifth means includes means for causing the first means to generate a pulse in the input signal.

15. A method of determining a waveform of a signal to be measured, the method comprising the steps of:
generating an input light of polarized light;
changing, responsive to an amplitude of the signal to be measured, a polarization state of the input light to generate an output light of polarized light;
generating, responsive to the output light, an interference pattern;
detecting a displacement of the interference pattern from a nominal position;
activating the detecting step a plurality of times, each time corresponding to a respective phase of the signal to be measured; and
means for calculating the amplitude of the signal to be measured from the displacement of the interference pattern.

* * * * *